United States Patent
Crank et al.

(10) Patent No.: US 7,132,365 B2
(45) Date of Patent: Nov. 7, 2006

(54) TREATMENT OF SILICON PRIOR TO NICKEL SILICIDE FORMATION

(75) Inventors: Sue Ellen Crank, Coppell, TX (US); Shirin Siddiqui, Plano, TX (US); Deborah J. Riley, Richardson, TX (US); Trace Quentin Hurd, Plano, TX (US); Peijun J. Chen, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/914,928

(22) Filed: Aug. 10, 2004

(65) Prior Publication Data

US 2006/0035463 A1    Feb. 16, 2006

(51) Int. Cl.
*H01L 21/4763* (2006.01)

(52) U.S. Cl. .................. 438/648; 438/630; 438/664
(58) Field of Classification Search ................ 438/630, 438/635, 664, 648, 651, 660, 683
See application file for complete search history.

(56) References Cited

U.S. PATENT DOCUMENTS 4,708,904 A    11/1987  Shimizu et al.
5,451,546 A *  9/1995  Grubisich et al. .......... 438/297
5,665,647 A *  9/1997  Ishigami ..................... 438/664
5,926,737 A *  7/1999  Ameen et al. .............. 438/649
6,677,234 B1*  1/2004  Guelen et al. .............. 438/664
6,737,716 B1*  5/2004  Matsuo et al. .............. 257/406
2002/0175413 A1* 11/2002  Lanzerotti et al. .......... 257/751

* cited by examiner

*Primary Examiner*—Phuc T. Dang
(74) *Attorney, Agent, or Firm*—Peter K. McLarty; W. James Brady, III; Frederick J. Telecky, Jr.

(57) ABSTRACT

A method of preparing a die comprises treating exposed silicon to form an oxide prior to silicide formation; and depositing metal on the oxide. The metal may comprise titanium, cobalt, nickel, platinum, palladium, tungsten, molybdenum, or combinations thereof on the oxide. The oxide may be less than or equal to about 15 angstroms thick. In various embodiments, treating exposed silicon to form an oxide comprises forming a non-thermal oxide. Treating exposed silicon to form an oxide may also comprise treating the exposed silicon with an oxidizing plasma; alternatively, treating exposed silicon to form an oxide may comprise forming a chemical oxide. In certain other embodiments, treating exposed silicon to form an oxide comprises treating exposed silicon with a solution comprising ammonium hydroxide, hydrogen peroxide, and water; hydrochloric acid, hydrogen peroxide, and water; hydrogen peroxide; ozone; ozonated deionized water; or combinations thereof.

10 Claims, 1 Drawing Sheet

TREATMENT OF SILICON PRIOR TO NICKEL SILICIDE FORMATION

TECHNICAL FIELD

The subject matter disclosed herein relates generally to semiconductor processing and in particular to a method of preparing a die for silicide formation via treating silicon to form an oxide prior to metal deposition.

BACKGROUND

Integrated circuits are fabricated on the surface of a semiconductor wafer in layers, and later singulated into individual semiconductor devices, or "dies." Many fabrication processes are repeated numerous times, constructing layer after layer until fabrication is complete. Metal layers, which typically increase in number as device complexity increases, include patterns of conductive material that are vertically insulated from one another by alternating layers of insulating material. Conductive traces are also separated within each layer by an insulating, or dielectric, material. Vertical, conductive tunnels called "vias" typically pass through insulating layers to form conductive pathways between adjacent conductive patterns. Defects in semiconductor devices may result from, among other things, diffusion of mobile species and deficiencies in the layers of materials forming device structures.

Metals are commonly employed in fabrication of semiconductor devices. Certain metals, e.g., cobalt, nickel, titanium, and platinum, may be suitable for employment as a constituent in formation of a metal silicide (or "silicide"), which may act as a low resistance contact between metal layers and the silicon substrate in a device. The processes involved in preparing a die for pre-silicide metal deposition and silicide formation may affect silicide film integrity, and the potential for undesirable diffusion of metal in the device.

SUMMARY

In some embodiments, a method for preparing a die comprises treating exposed silicon to form an oxide prior to suicide formation and depositing metal on the oxide. The metal may comprise titanium, cobalt, nickel, platinum, palladium, tungsten, molybdenum, or combinations thereof on the oxide. The oxide may be less than or equal to about 15 angstroms thick. In various embodiments, treating exposed silicon to form an oxide comprises forming a non-thermal oxide. Treating exposed silicon to form an oxide may also comprise treating the exposed silicon with an oxidizing plasma; alternatively, treating exposed silicon to form an oxide may comprise forming a chemical oxide. In certain other embodiments, treating exposed silicon to form an oxide comprises treating exposed silicon with a solution comprising ammonium hydroxide, hydrogen peroxide, and water; hydrochloric acid, hydrogen peroxide, and water; hydrogen peroxide; ozone; ozonated deionized water; or combinations thereof. The time between treating exposed silicon to form an oxide and depositing metal on the oxide may be in a range from about 0 to about 60 hours.

In embodiments, a method for improving silicide film integrity comprises oxidizing exposed silicon on a die, depositing metal on the oxidized silicon, and heating the die comprising metal on oxidized silicon to form a silicide. The method may further comprise treating the die to expose silicon prior to oxidizing exposed silicon.

In other embodiments, a system for forming metal silicide comprises a vessel wherein oxide is formed on a die comprising exposed silicon; and a processing chamber wherein a metal source is disposed to deposit metal on the oxide. The vessel in which oxide is formed may comprise a wet chemical tank, a plasma reactor, or combinations thereof. The processing chamber may deposit metal via sputtering. In certain embodiments, the silicide is formed at a temperature in a range from about 250 to about 500 degrees Celsius.

NOTATION AND NOMENCLATURE

Certain terms are used throughout the following description and claims to refer to particular components. As one skilled in the art will appreciate, companies may refer to a component by different names. This document does not intend to distinguish between components that differ in name but not function. Also employed throughout this document are the terms "including" and "comprising," which are used in an open-ended fashion, and thus should be interpreted to mean "including, but not limited to . . . ".

The term "integrated circuit" or "IC" refers to a set of electronic components and their interconnections (internal electrical circuit elements, collectively) that are patterned on the surface of a microchip. The term "semiconductor device" refers generically to an integrated circuit (IC). The term "die" ("dies" for plural) refers generically to an integrated circuit or semiconductor device, which may be a portion of a wafer, in various stages of completion, including the underlying semiconductor substrate, insulating materials, and all circuitry patterned thereon.

DETAILED DESCRIPTION OF EMBODIMENTS

Figure 1:
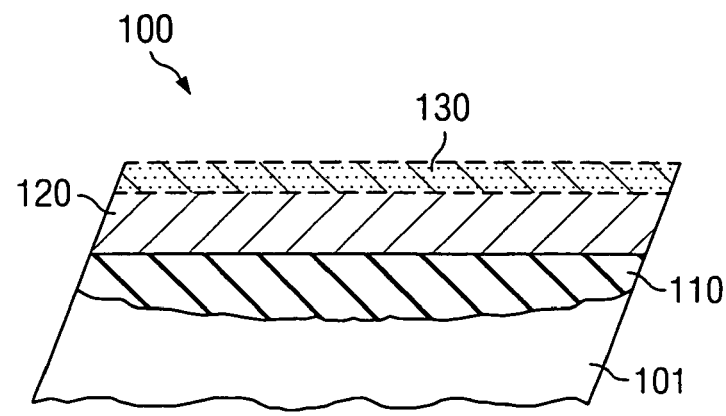
FIG. 1 illustrates a cross-sectional view of materials in a semiconductor device that may be involved in preparing a die for metal silicide formation.

FIG. 1 illustrates an embodiment of a semiconductor structure 100 involved in preparing a die for silicided formation. The view of FIG. 1 is a cross-section of a semiconductor structure 100, e.g., a die, die sample, or portion of a wafer, at an intermediate point in the construction of an IC. In various embodiments, preparing for silicided formation comprises treating exposed silicon to form an oxide 110, and depositing a metal 120 on the oxide 110. In certain embodiments, the metal 120 is nickel, which for silicided formation reacts with silicon to form nickel silicided (not shown). Further in the embodiment of FIG. 1 is a titanium nitride 130 protective layer.

Figure 2:
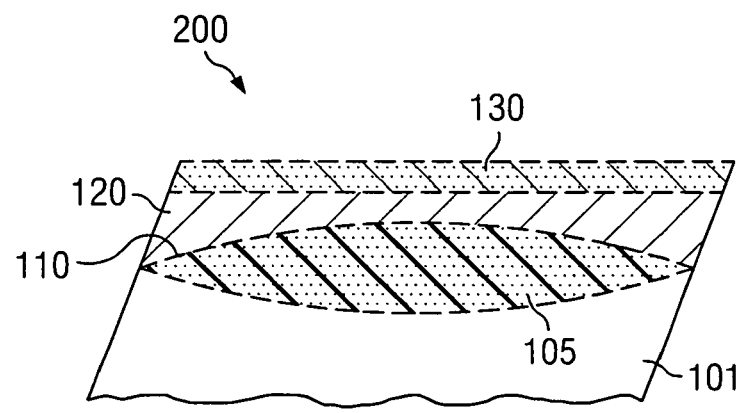
FIG. 2 illustrates another cross-sectional view of materials in a semiconductor device after a metal reacts with silicon to form a metal silicide.

FIG. 2 illustrates an embodiment of a semiconductor structure 200 after formation of silicide 105, where nickel is employed as the metal 120. Formation of nickel silicide 105 is carried out after forming an oxide 110 on exposed silicon 101 and depositing nickel 120 on the oxide 110. FIG. 2 shows nickel silicide 105 formed between silicon 101 and nickel 120. After formation, the oxide 110 may primarily be at the interface of the nickel silicide 105 and any unreacted nickel 120. During formation the nickel 120 diffuses through the oxide 110 and reacts with the silicon 101 to form nickel silicide 105. Thus, some of the silicon 101 and some of the nickel 120 are consumed in formation of nickel silicide 105.

The metal 120 can be any metal effective for reacting with silicon to form a silicide that creates a low resistance contact between metal layers and the silicon substrate. As technology advances and the dimensions of structures within semiconductor devices shrink, some metals may be more suitable than others. In some embodiments, the metal 120 comprises titanium, cobalt, nickel, platinum, palladium, tungsten, molybdenum, or combinations thereof. Some examples of considerations when selecting a metal comprise silicon consumption during silicide formation, diffusion rate, thermal stability of the desired phase of silicide, and electrical characteristics, such as junction integrity, contact resistance, and sheet resistance.

The treatment employed to form the oxide affects the characteristics of the oxide, which in turn may impact diffusion of metal to the silicon and silicide integrity. Some pertinent characteristics of the oxide may comprise density, stoichiometry, thickness, hydrogen content, $OH^-$ content, and uniformity. In some embodiments, treating exposed silicon forms a non-thermal oxide. Examples of non-thermal oxides comprise chemical oxides and oxides formed via treating exposed silicon with an oxidizing plasma source. Examples of oxidizing plasma sources for treating silicon prior to metal deposition comprise a direct energetic plasma of $Ar^+$, $He^+$, $Ne^+$ in combination with an oxygen source, such as $O_2$ or $H_2O$; and a remote plasma that contains reactive oxidizing radicals of $O^*$ or $OH^*$. In certain embodiments, chemical oxides are oxides formed via treating exposed silicon with a solution comprising ammonium hydroxide, hydrogen peroxide, and water; hydrochloric acid, hydrogen peroxide, and water; hydrogen peroxide; ozonated deionized water; or combinations thereof.

Effective treatments of exposed silicon to form an oxide typically control oxide thickness. In certain embodiments, as measured by an Opti-Probe® with a desorber manufactured by Therma-Wave of Fremont, Calif., the thickness of the oxide may be less than or equal to about 15 angstroms; alternatively, less than or equal to about 12 angstroms; alternatively, less than or equal to about 10 angstroms.

The oxide formed via treating exposed silicon may also be a protective layer for the silicon. Whereas typically the time window between exposing silicon and depositing pre-silicide metal may have been a concern, forming an oxide on the exposed silicon may reduce such concerns. Thus, the protective oxide layer may add manufacturing robustness. In some embodiments, the time window between exposing silicon and depositing pre-silicide metal is in a range from about 0 to about 24 hours; alternatively, the time window is in a range from about 0 to about 12 hours; alternatively, from about 0 to about 2 hours. In other embodiments, the time window between treating exposed silicon to form an oxide and depositing pre-silicide metal is in a range from about 0 to about 120 hours; alternatively, from about 0 to about 60 hours.

It is believed the oxide on the silicon provides a more desirable surface for the silicon prior to metal deposition. Exposed silicon may be substantially lacking in stability and uniformity, and susceptible to undesirable reactions and diffusion before and after metal deposition. It is believed the oxide layer permits metal diffusion necessary for silicide formation while also providing a more stable surface on the silicon. In at least some cases, the oxide layer may be associated with less variation in island diode leakage and breakdown, less variation in contact resistance, and less variation in transistor gain.

Silicides (or "metal suicides") are typically employed in semiconductor devices to create low resistance contact between metal layers and the silicon substrate. Silicide, which includes a self-aligned silicide or "salicide," is the product of a reaction between metal and silicon. The characteristics of the suicide and silicide formation process may vary substantially depending on the type of metal employed. Silicides of cobalt, for example, may possess higher resistance and consume more silicon during formation than silicides of nickel. Also, the quality of the silicide formed with a single metal may vary depending on reaction conditions. For example, the silicide of nickel with silicon may comprise different phases, e.g., di-nickel silicide (Ni2Si), nickel di-silicide (NiSi2), and/or nickel silicide (NiSi). Reaction kinetics, e.g., time and temperature, typically determine which silicide phase is formed and/or the proportions of each silicide phase formed. In the case of nickel, NiSi possesses substantially lower resistance and is, thus, typically more desirable in the role of contact silicide. In at least some instances, the desired silicide is NiSi and formation of an oxide on exposed silicon prior to metal deposition may minimize formation of unwanted NiSi2 and Ni2Si.

Figure 3:
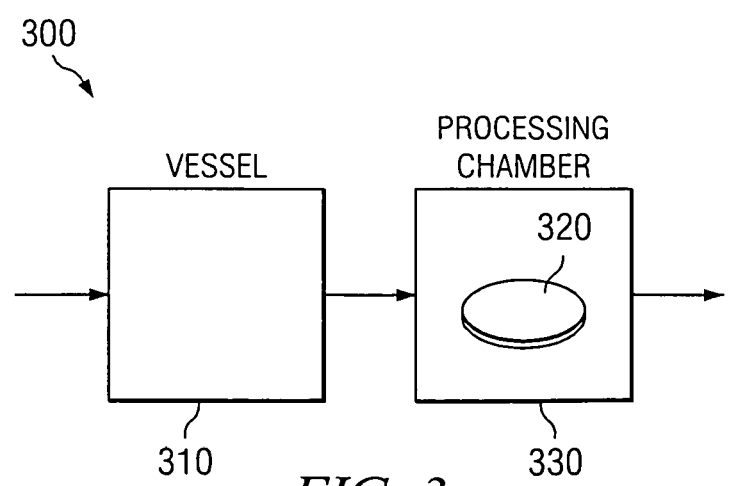
FIG. 3 illustrates a system for preparing a die and carrying out suicide formation.

Also provided in the present application is a system 300 for forming silicide, an aspect of which is illustrated by FIG. 3. In some embodiments, the system 300 comprises a vessel 310 and a processing chamber 330. A die (not shown) including exposed silicon is placed in the vessel 310 for processing. The vessel 310 may treat the exposed silicon to form an oxide. Subsequently, the die is transferred from the vessel 310 to the processing chamber 330. A metal source 320 may be disposed in the processing chamber 330 at conditions effective for depositing metal on the oxide. In some embodiments, the processing chamber 330 effects both deposition and silicide formation. Thus, after metal deposition, suicide formation may also be accomplished in the processing chamber 330.

In some embodiments, forming an oxide on exposed silicon in the vessel 310 may be preceded by a process for exposing silicon. Such a process for exposing silicon would not typically be carried out in the vessel 310 where an oxide is formed. Effective techniques for exposing silicon may be those characteristically employed by one skilled in the art. In at least one case, the process for exposing silicon prior to forming an oxide comprises a hydrofluoric acid treatment. Such a hydrofluoric acid treatment may comprise hydrofluoric acid in the gas phase, liquid phase, or combinations thereof. As an example, in order to expose silicon the die may be treated in a chemical bath comprising a 0.2–1 percent by volume hydrofluoric acid solution in deionized water at 23 degrees Celsius for 1–10 minutes.

In various embodiments, the vessel 310 receives a die comprising exposed silicon and is set at conditions effective for forming an oxide on the exposed silicon as described above. In certain cases, the vessel 310 may comprise a wet chemical tank, plasma reactor, or combinations thereof. An example of an appropriate wet chemical tank is that found in the F-Wet FC-821L manufactured by DNS Electronics of Sunnyvale, Calif. An example of conditions appropriate for forming an oxide on exposed silicon in the F-Wet FC-821L may comprise a mixture of 0.1–10 weight percent hydrochloric acid, 0.3–10 weight percent hydrogen peroxide, and the remainder water; and a process time and temperature of 10 minutes at 25 degrees Celsius.

The processing chamber 330 may receive the die comprising oxide on silicon. In at least one embodiment, the processing chamber 330 first deposits metal on the oxide and then achieves conditions effective for forming the metal silicide. In some cases a protective layer may be deposited on the metal before formation. An example of such a protective layer is a titanium nitride layer. Such a protective layer may help prevent oxidation of the metal. An example of an occasion presenting risk of oxidation is where there is a delay between metal deposition and silicide formation, such as where metal deposition and silicide formation occur in separate chambers as described below. The protective layer may remain on the die during silicide formation. In certain embodiments, the processing chamber 330 may accomplish all of deposition of a metal, deposition of a protective layer, and silicide formation. The deposition(s) may be accomplished via any means effective for putting down a metal and optionally a protective layer as described herein. In various embodiments, the deposition(s) occur via sputtering as would typically be effected by those skilled in the art. An example of a processing chamber suitable for depositing a metal, optionally depositing a protective layer, and forming silicide is the Endura 5500 manufactured by Applied Materials of Santa Clara, Calif. Conditions effective for silicide formation may comprise a temperature range from about 250 to about 500 degrees Celsius at a pressure in the range from about $10^{-8}$ to about 760 torr.

Variations among components of the system 300 are practicable. In at least one instance, the system 300 is designed to form self-aligned silicide or "salicide". In some embodiments, a separate deposition chamber (not shown) may precede the processing chamber 330 and accomplish metal deposition following oxide formation in the vessel 310. In cases where a protective layer, e.g., titanium nitride, is needed as well, such a deposition chamber may accomplish deposition, e.g., via sputtering, of both the metal and protective layer. Methods of executing such a deposition may be those methods employed by one skilled in the art. An example of such a deposition chamber is the Endura 5500 manufactured by Applied Materials of Santa Clara, Calif.

Yet additional components may optionally be employed in the system 300 for forming silicide. In some embodiments, the die having oxidized silicon may be treated in a plasma reactor (not shown) prior to metal deposition. Such a plasma reactor typically exposes the oxidized silicon to a plasma etch. An example of a process sequence including a plasma reactor may be: form oxide on exposed silicon, expose to plasma etch, deposit metal, and form silicide. Methods of contacting with a plasma etch prior to metal deposition may be those methods typically employed by one skilled in the art. Examples of suitable plasma sources comprise the Pre-Sputter Etch Endura Chamber manufactured by Applied Materials of Santa Clara, Calif., or the Highlands Ash Chamber manufactured by Mattson of Fremont, Calif.

In additional embodiments, the system 300 may comprise one piece of equipment. An example of such a scheme would comprise treating exposed silicon to form an oxide, depositing a metal and optionally a protective layer, and forming silicide, all of which may be executed in the same chamber. In at least one embodiment, a processing chamber receives a die comprising exposed silicon, forms a non-thermal oxide on the exposed silicon, deposits nickel on the oxide, and executes silicide formation as described herein.

While various embodiments of the invention have been shown and described, modifications thereof can be made by one skilled in the art without departing from the spirit and teachings of the invention. The embodiments described herein are exemplary only, and are not intended to be limiting. Equivalent techniques and ingredients may be substituted for those shown, and other changes can be made within the scope of the present invention as defined by the appended claims. Many variations and modifications of the invention disclosed herein are possible and are within the scope of the invention. Accordingly, the scope of protection is not limited by the description set out above, but is only limited by the claims which follow, that scope including all equivalents of the subject matter of the claims.

What is claimed is:

1. A method for improving silicide film integrity, comprising:
   oxidizing exposed silicon on a die to form a non-thermal oxide;
   depositing metal on the oxide; and
   heating the die comprising metal on oxide to form a silicide under the oxide.

2. The method of claim 1 further comprising treating the die to expose silicon prior to forming the oxide.

3. The method of claim 2 wherein treating the die to expose silicon comprises contacting the die with a hydrofluoric acid solution.

4. The method of claim 1 further comprising depositing titanium nitride on the metal prior to heating.

5. The method of claim 1 wherein depositing metal on the oxide comprises depositing titanium, cobalt, nickel, platinum, palladium, tungsten, molybdenum, or combinations thereof on the oxidized silicon.

6. The method of claim 1 wherein oxidizing the exposed silicon to form the oxide comprises treating the exposed silicon with an oxidizing plasma source.

7. The method of claim 1 wherein oxidizing the exposed silicon to form the oxide comprises forming a chemical oxide.

8. The method of claim 1 wherein oxidizing the exposed silicon to form the oxide comprises treating the exposed siicon with a solution comprising ammonium hydroxide, hydrogen peroxide, and water; hydrochloric acid, hydrogen peroxide, and water; hydrogen peroxide; ozone; ozonated deionized water; or combinations thereof.

9. The method of claim 1 further comprising contacting the die with a plasma source after forming the oxide and prior to depositing metal.

10. The method of claim 1 wherein the metal diffuses through the oxide to form the silicide.

* * * * *